(12) United States Patent
Liu et al.

(10) Patent No.: US 11,082,147 B2
(45) Date of Patent: Aug. 3, 2021

(54) PROCESSING METHOD, DEVICE AND SYSTEM FOR OVERLAP MULTIPLEXING SYSTEM

(71) Applicant: SHEN ZHEN KUANG-CHI HEZHONG TECHNOLOGY LTD, Shenzhen (CN)

(72) Inventors: Ruopeng Liu, Shenzhen (CN); Chunlin Ji, Shenzhen (CN); Zihong Liu, Shenzhen (CN)

(73) Assignee: SHEN ZHEN KUANG-CHI HEZHONG TECHNOLOGY LTD, Shenzhen (CN)

( * ) Notice: Subject to any disclaimer, the term of this patent is extended or adjusted under 35 U.S.C. 154(b) by 19 days.

(21) Appl. No.: 16/659,515

(22) Filed: Oct. 21, 2019

(65) Prior Publication Data

US 2020/0052721 A1 Feb. 13, 2020

Related U.S. Application Data

(63) Continuation of application No. PCT/CN2018/079724, filed on Mar. 21, 2018.

(30) Foreign Application Priority Data

Apr. 27, 2017 (CN) .......................... 201710292741.5

(51) Int. Cl.
*H04J 99/00* (2009.01)
*H03M 13/45* (2006.01)
(Continued)

(52) U.S. Cl.
CPC ........... *H04J 15/00* (2013.01); *H03M 13/258* (2013.01); *H03M 13/2742* (2013.01);
(Continued)

(58) Field of Classification Search
CPC ....... H04J 15/00; H03M 13/45; H03M 13/258
See application file for complete search history.

(56) References Cited

U.S. PATENT DOCUMENTS 6,480,551 B1 * 11/2002 Ohishi ................ G06F 11/2028
340/2.9
6,826,233 B1 * 11/2004 Oosawa ................ H04L 1/0041
375/240.24
(Continued)

FOREIGN PATENT DOCUMENTS

CN 101090306 A 12/2007
CN 101388672 A 3/2009
(Continued)

OTHER PUBLICATIONS

Han, Shuangshuang, "Iterative Receiver Technologies in Wireless Communication Systems" Electronic Technology & Information Science, China Master's Theses Full-Text Database, May 15, 2010, 1136-271, pp. 47-54.
(Continued)

*Primary Examiner* — Joseph D Torres
(74) *Attorney, Agent, or Firm* — Cantor Colburn LLP

(57) ABSTRACT

Provided are a processing method, device, and system for an overlapped multiplexing system. The method includes: receiving encoded information output by a transmit end, where the encoded information is information obtained by performing error-correcting code encoding and overlapped multiplexing encoding on input information; decoding the encoded information according to an overlapped multiplexing decoding algorithm, to obtain a first decoding result; performing error-correcting processing on the first decoding result according to an error-correcting code decoding algorithm, to obtain a second decoding result; and outputting the second decoding result.

18 Claims, 8 Drawing Sheets

(51) Int. Cl.
  *H03M 13/25* (2006.01)
  *H04L 1/00* (2006.01)
  *H03M 13/27* (2006.01)

(52) U.S. Cl.
  CPC .......... *H03M 13/45* (2013.01); *H04L 1/0061* (2013.01); *H04L 1/0071* (2013.01)

(56) References Cited

U.S. PATENT DOCUMENTS

| | | | | |
|---|---|---|---|---|
| 2006/0291569 A1* | 12/2006 | Kabuto | .............. | H04N 21/4334 375/240.25 |
| 2011/0103236 A1* | 5/2011 | Li | .................... | H04J 13/0007 370/252 |
| 2011/0182169 A1* | 7/2011 | Li | ...................... | H04J 13/004 370/203 |

FOREIGN PATENT DOCUMENTS

| | | | |
|---|---|---|---|
| CN | 101662331 A | 3/2010 |
| CN | 105634504 A | 6/2016 |
| WO | 2008084532 A1 | 7/2008 |

OTHER PUBLICATIONS

International Search Report for corresponding application PCT/CN2018/079724 filed Mar. 21, 2018; dated May 31, 2018.

European Search Repport for corresponding application EP 18 79 2081; dated Dec. 10, 2020.

Suhua Zhou, "A Novel Symbol-interleaved Serially Concatenated Overlapped Multiplexing System", 2009 2nd International Conference on Power Electronics and Intelligent Transportation System, PEITS 2009.

Xia Xhang, "Overlapped Time Division Multiplexing System Using Turbo Product Code", Beijing University of Posts and Telecommumications, 2010.

Xia Zhang, "The Analysis of Coded Overlapped Time Division Multiplexing System", Beijing University of Posts and Telecommunications, Proceedings ofIC-BNMT 2010.

Xilin Zhang, "An ISI Transmission and the Optimal Detection/Decoding of the Coded ISI System", School of Information and Engineering, Proceedings of IWSDA, 2007.

Xuesong Wang, "A Fast Detection Algorithm for Concatenated Overlapped Code Division Multiplexing System", Beijing University of Posts and Telecommumications, 2010.

\* cited by examiner

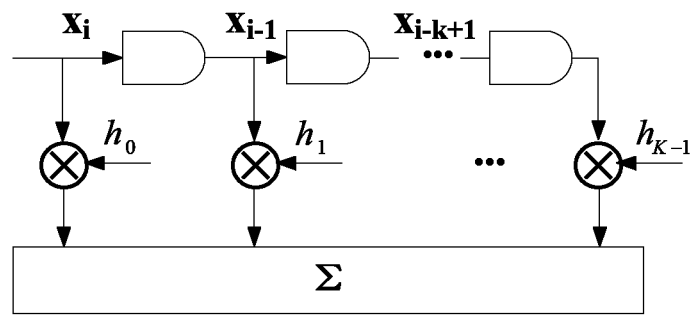
FIG. 3
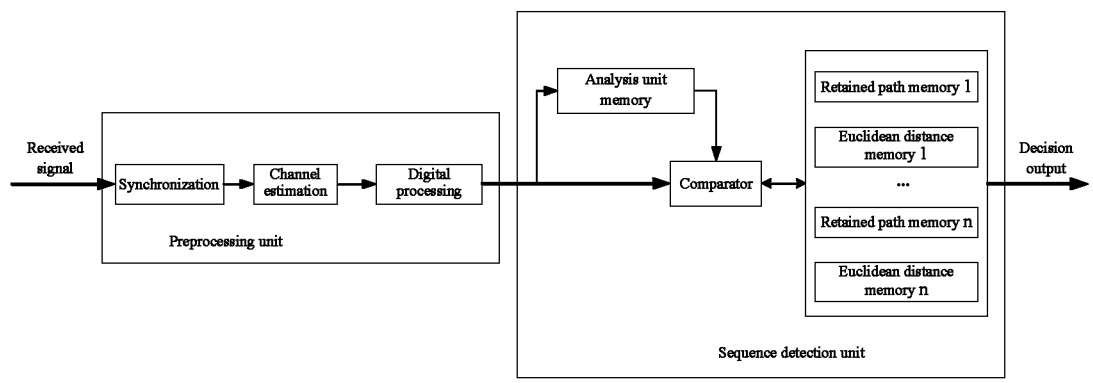
FIG. 4
$$a_0x_0 \quad a_1x_0 \quad a_2x_0 \quad \cdots \quad a_{k-1}x_0$$
$$a_0x_1 \quad a_1x_1 \quad a_2x_1 \quad \cdots \quad a_{k-1}x_1$$
$$a_0x_2 \quad a_1x_2 \quad a_2x_2 \quad \cdots \quad a_{k-1}x_2$$
$$\cdots$$
$$a_0x_{k-1} \quad a_1x_{k-1} \quad a_2x_{k-1} \quad \cdots \quad a_{k-1}x_{k-1}$$
FIG. 5

US 11,082,147 B2

PROCESSING METHOD, DEVICE AND SYSTEM FOR OVERLAP MULTIPLEXING SYSTEM

CROSS REFERENCE TO RELATED APPLICATIONS

This application is a continuation of International Patent Application Number PCT/CN2018/079724 filed on Mar. 21, 2018, which claimed priority to Chinese Patent Application Number 201710292741.5 filed on Apr. 27, 2017, all of which said applications are incorporated herein by reference in their entirety.

TECHNICAL FIELD

The present disclosure relates to the field of overlapped multiplexing systems, and specifically, to a processing method, device, and system for an overlapped multiplexing system.

BACKGROUND

An advantage of an overlapped multiplexing system (OvXDM) lies in overlapped multiplexing, and a encoding constraint relationship is used to improve spectrum efficiency. X indicates any domain, for example, time domain T, that is, OvTDM (Overlapped Time Division Multiplexing); or similarly, space domain S, that is, OvSDM (Overlapped Space Division Multiplexing); frequency domain F, that is, OvFDM (Overlapped Frequency Division Multiplexing); code domain C, that is, OvCDM (Overlapped Code Division Multiplexing); or hybrid domain H, that is, OvHDM (Overlapped Hybrid Division Multiplexing), or the like. In the OvXDM system, as the spectrum efficiency is improved, a threshold signal-to-noise ratio also increases accordingly, and a encoding gain is relatively low under low spectrum efficiency. In addition, this system has a relatively simple structure and a limited error-correcting capability. Therefore, as a quantity K of overlapping times increases, a bit error rate also increases accordingly, thereby harming system reliability.

For a prior-art problem that an overlapped multiplexing system has a poor error-correcting capability, and consequently has low reliability, no effective solution is currently proposed.

SUMMARY

Embodiments of the present disclosure provide a processing method, device, and system for an overlapped multiplexing system, to at least resolve a prior-art technical problem that an overlapped multiplexing system has a poor error-correcting capability, and consequently has low reliability.

According to an aspect of the embodiments of the present disclosure, a processing method for an overlapped multiplexing system is provided, including: receiving encoded information output by a transmit end, where the encoded information is information obtained by performing error-correcting code encoding and overlapped multiplexing encoding on input information; decoding the encoded information according to an overlapped multiplexing decoding algorithm, to obtain a first decoding result; performing error-correcting processing on the first decoding result according to an error-correcting code decoding algorithm, to obtain a second decoding result; and outputting the second decoding result.

According to another aspect of the embodiments of the present disclosure, a processing device for an overlapped multiplexing system is further provided, including: a receiving module, configured to: receive encoded information output by a transmit end, where the encoded information is information obtained by performing error-correcting code encoding and overlapped multiplexing encoding on input information; a first decoding module, configured to: decode the encoded information according to an overlapped multiplexing decoding algorithm, to obtain a first decoding result; a second decoding module, configured to: perform error-correcting processing on the first decoding result according to an error-correcting code decoding algorithm, to obtain a second decoding result; and an output module, configured to: output the second decoding result.

According to another aspect of the embodiments of the present disclosure, a processing system for an overlapped multiplexing system is further provided, including: a transmit end, configured to: output encoded information, where the encoded information is obtained by performing error-correcting code encoding and overlapped multiplexing encoding on input information; a receive end, having a communication relationship with the transmit end and configured to: decode the encoded information according to an overlapped multiplexing decoding algorithm, to obtain a first decoding result; perform error-correcting processing on the first decoding result according to an error-correcting code decoding algorithm, to obtain a second decoding result; and output the second decoding result.

According to another aspect of the embodiments of the present disclosure, a storage medium is further provided, where the storage medium includes a stored program, and when the program runs, a device on which the storage medium is located is controlled to perform the processing method for an overlapped multiplexing system in the foregoing embodiment.

According to another aspect of the embodiments of the present disclosure, a processor is further provided, where the processor is configured to run a program, and when the program runs, the processing method for an overlapped multiplexing system in the foregoing embodiment is performed.

According to another aspect of the embodiments of the present disclosure, a terminal is further provided, including: a receiving device, configured to: receive encoded information output by a transmit end, where the encoded information is information obtained by performing error-correcting code encoding and overlapped multiplexing encoding on input information; and a storage medium, configured to: store a program, where the following processing steps are performed on data output by the receiving device when the program runs: decoding the encoded information according to an overlapped multiplexing decoding algorithm, to obtain a first decoding result; performing error-correcting processing on the first decoding result according to an error-correcting code decoding algorithm, to obtain a second decoding result; and outputting the second decoding result.

According to another aspect of the embodiments of the present disclosure, a terminal is further provided, including: a receiving device, configured to: receive encoded information output by a transmit end, where the encoded information is information obtained by performing error-correcting code encoding and overlapped multiplexing encoding on input information; and a processor, where the processor runs a program, and when the program runs, the following processing steps are performed on data output by the receiving device: decoding the encoded information according to an overlapped multiplexing decoding algorithm, to obtain a first decoding result; performing error-correcting processing on the first decoding result according to an error-correcting code decoding algorithm, to obtain a second decoding result; and outputting the second decoding result.

In the embodiments of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

BRIEF DESCRIPTION OF DRAWINGS

The drawings described herein provide further understanding of the present disclosure, and form a part of this application. Schematic embodiments of the present disclosure and descriptions thereof are used to explain the present disclosure but do not constitute an inappropriate limitation on the present disclosure. In the drawings:

FIG. 3 is an optional schematic diagram of an OvTDM waveform convolutional encoding model according to an embodiment of the present disclosure;

FIG. 4 is an optional schematic diagram of a received signal of an OvTDM system according to an embodiment of the present disclosure;

FIG. 5 is an optional schematic diagram of multiplexing of K waveforms according to an embodiment of the present disclosure;

DESCRIPTION OF EMBODIMENTS

Figure 1:
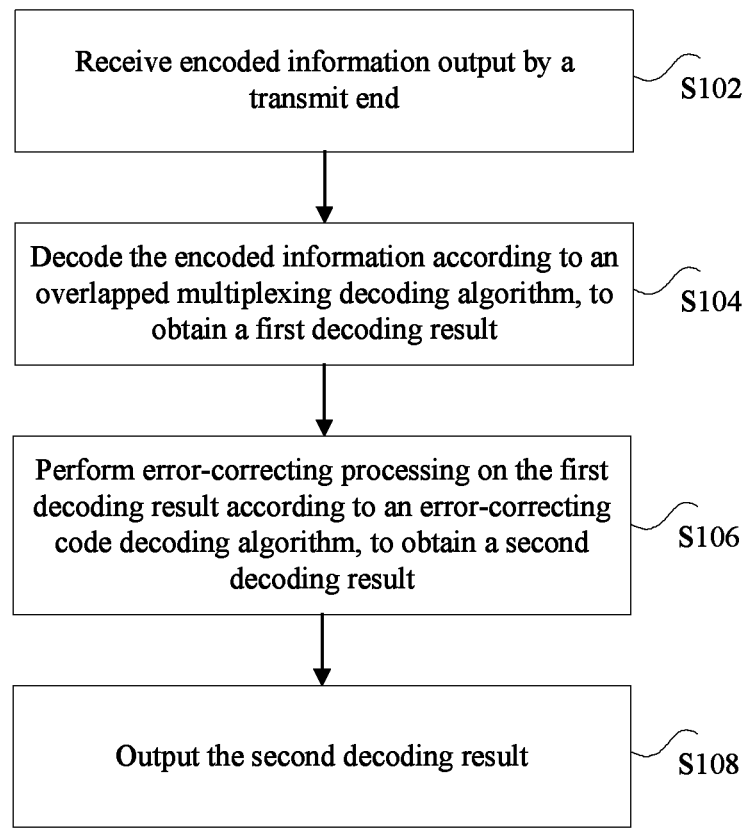
FIG. 1 is a flowchart of a processing method for an overlapped multiplexing system according to an embodiment of the present disclosure.

To make a person skilled in the art better understand solutions of the present disclosure, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

It should be noted that terms such as "first" and "second" in the specification, claims, and accompanying drawings of the present disclosure are used to distinguish between similar objects, and are not necessarily used to describe a particular sequence or order. It should be understood that data used in such a way may be interchangeable in a proper circumstance, so that the embodiments of the present disclosure described herein can be implemented in a sequence other than those shown in the drawings or described herein. Moreover, terms "including", "having", and any other variants mean to cover a non-exclusive inclusion, for example, a process, method, system, product, or device that includes a list of steps or units is not necessarily limited to those steps or units that are expressly listed, but may include other units not expressly listed or inherent to such a process, method, system, product, or device.

Embodiment 1

According to this embodiment of the present disclosure, an embodiment of a processing method for an overlapped multiplexing system is provided. It should be noted that steps shown in a flowchart of a drawing may be performed in a computer system of a group of computer executable instructions. In addition, although a logical sequence is shown in the flowchart, in some circumstances, the shown or described steps may be performed in a sequence different from the sequence herein.

FIG. 1 is a flowchart of a processing method for an overlapped multiplexing system according to an embodiment of the present disclosure. As shown in FIG. 1, the method includes the following steps:

Step S102: Receive encoded information output by a transmit end, where the encoded information is information obtained by performing error-correcting code encoding and overlapped multiplexing encoding on input information.

Specifically, the overlapped multiplexing encoding above may be OvXDM encoding. In this embodiment of the present disclosure, an OvTDM system is used as an example for detailed description. Based on communication domain selection and conversion, a person skilled in the art may apply the solution provided in this embodiment to another overlapped multiplexing system. For example, in an OvFDM, Fourier transform may be performed on a received signal, and then related processing is performed, so that processing steps may be converted into processing steps similar to those for OvTDM.

Figure 2:
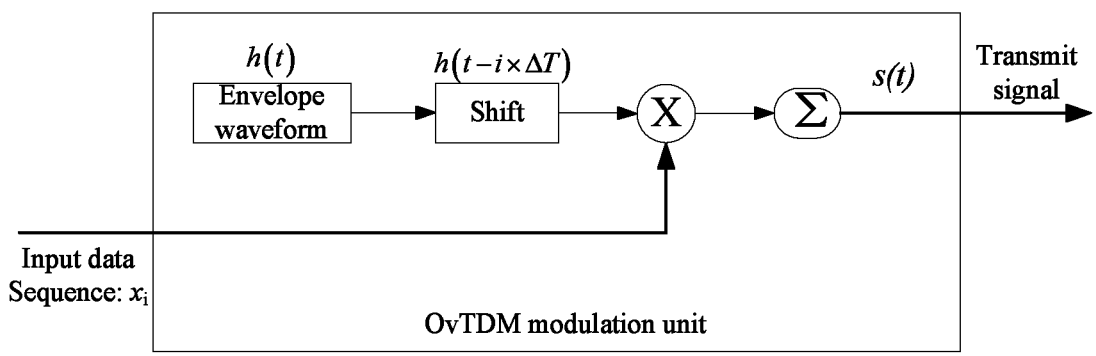
FIG. 2 is an optional schematic diagram of a transmit signal of an OvTDM system according to an embodiment of the present disclosure.

A block diagram of a transmit signal of an OvTDM system is shown in FIG. 2. An OvTDM waveform convolutional encoding model is shown in FIG. 3. Specific steps are as follows: (1) First, design and generate a transmit signal envelope waveform h(t). (2) Perform a specific time shift on the envelope waveform h(t) designed in (1), to form transmit signal envelope waveforms h(t−i×ΔT) of other moments. (3) Multiply a to-be-sent symbol $x_i$ by an envelope waveform h(t−i×ΔT) of a corresponding moment that is generated in (2), to obtain to-be-sent signal waveforms $x_i$h(t−i×ΔT) of the moments. (4) Overlap the to-be-sent signal waveforms $x_i$h(t−i×ΔT) formed in (3), to form a transmit signal waveform. (5) The transmit signal may be represented as follows:

$$s(t) = \sum_i x_i h(t - i \times \Delta T),$$

where the to-be-sent symbol $x_i$ corresponds to an input data sequence $P_i$ in 1. A block diagram of an OvTDM received signal is shown in FIG. 4. After preprocessing, such as synchronization, channel estimation, and digital processing, is sequentially performed on the received signal, sequence detection is performed on the signal. Specifically, in a detection procedure of a sequence detection unit, an analysis unit memory makes a complex convolutional encoding model and a trellis diagram of an overlapped time division multiplexing system, and lists and stores all states of the overlapped time division multiplexing system; a comparator finds, based on the trellis diagram in the analysis unit memory, a path with a minimum Euclidean distance or a weighted minimum Euclidean distance to a received digital signal; and a retained path memory and an Euclidean distance memory or a weighted Euclidean distance memory are respectively configured to store a retained path and an Euclidean distance or a weighted Euclidean distance that are output by the comparator. One retained path memory and one Euclidean distance memory or weighted Euclidean distance memory need to be prepared for each stable state. Preferably, a length of the retained path memory may be 4K-5K. Preferably, the Euclidean distance memory or the weighted Euclidean distance memory stores only a relative distance.

Multiplexing of K waveforms is shown in FIG. 5. The diagram is in a shape of a parallelogram. Each row represents a to-be-sent signal waveform $x_i$h(t−i*ΔT) obtained after a to-be-sent symbol $x_i$ is multiplied by an envelope waveform h(t−i*ΔT) of a corresponding moment. $a_0$ to $a_{k-1}$ represent a coefficient value of each part obtained after each window function waveform (an envelope waveform) is segmented for K times, and are specifically a coefficient related to an amplitude.

Figure 6:
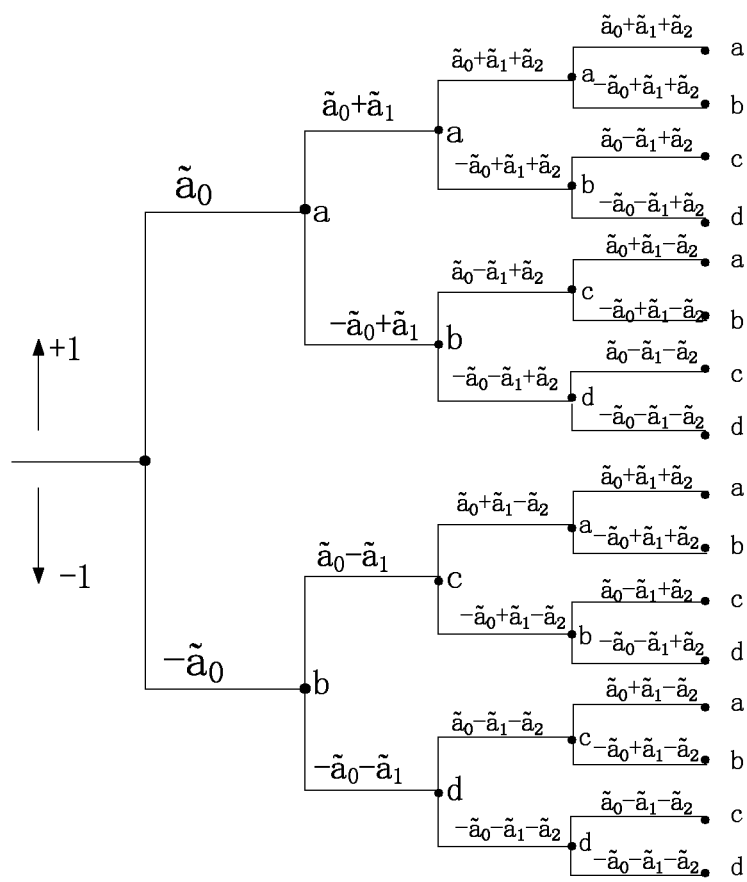
FIG. 6 is an optional input-output relationship diagram of an OvTDM system according to an embodiment of the present disclosure.
Figure 7:
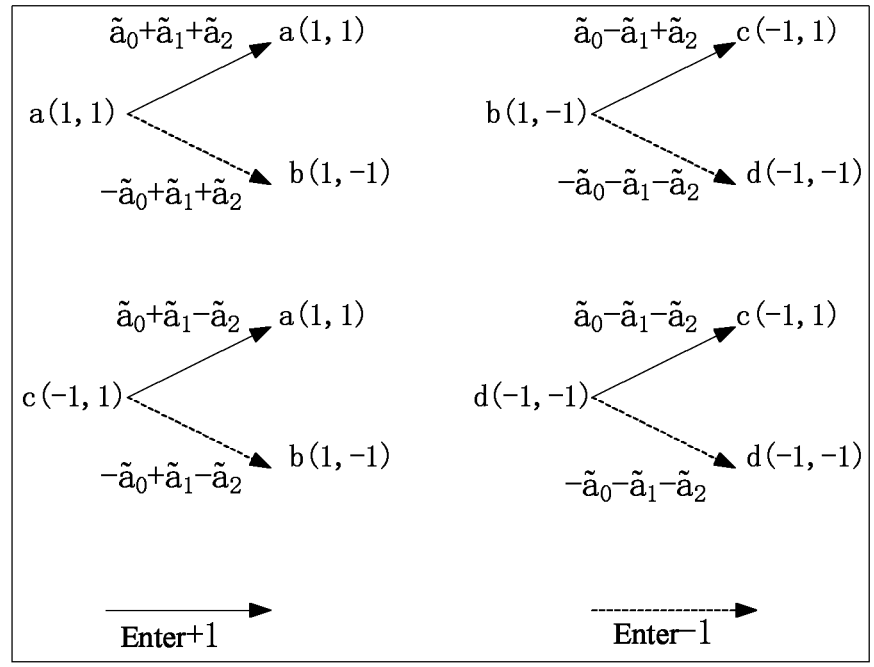
FIG. 7 is an optional node state transition diagram of an OvTDM system according to an embodiment of the present disclosure.

An input-output relationship diagram of an OvTDM system is shown in FIG. 6. At a node, an upward direction is +1, and a downward direction is −1. Determining is performed on each node, to finally obtain a node transition path. Based on the transition relationship, an input symbol sequence can be obtained. A specific node state transition diagram is shown in FIG. 7. A state transition manner for a node is any one of those in FIG. 7, provided that various transition possibilities are determined and a transition manner is determined.

Figure 8:
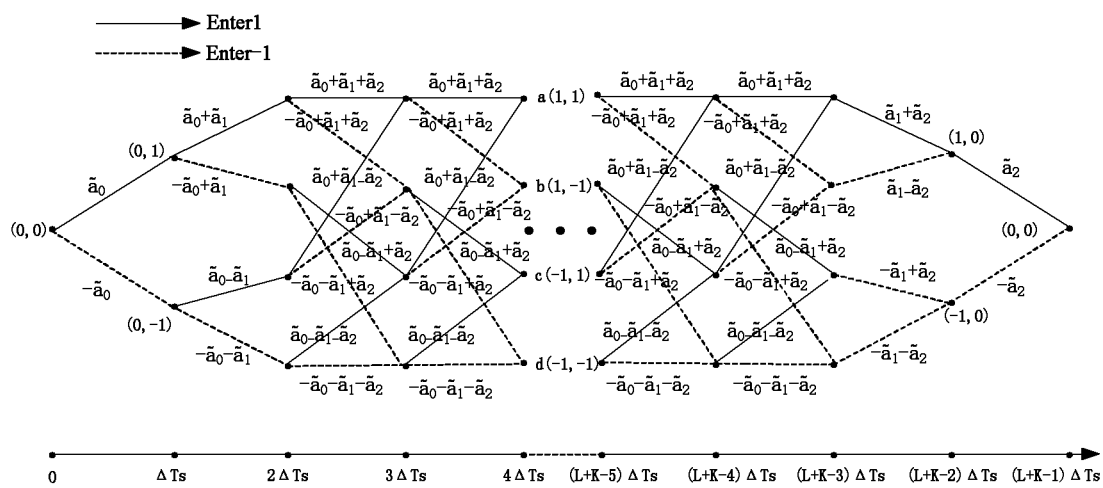
FIG. 8 is an optional trellis diagram of an OvTDM system according to an embodiment of the present disclosure.

A trellis diagram of an OvTDM system is shown in FIG. 8. The diagram is an overall state transition diagram for all nodes in an entire output process.

The transmit end transmits an encoded and modulated signal by using an antenna. The signal is transmitted in a wireless channel. A receive end first performs preprocessing on the received signal, then performs matching and filtering on the received signal, then performs sampling and decoding on the signal, and finally performs decision and outputs a bit stream. Specific steps are as follows: (1) First, synchronize received signals, including carrier synchronization, frame synchronization, symbol time synchronization, and the like. (2) Perform digital processing on received signals in each frame based on a sampling theorem. (3) Cut a received waveform based on a waveform transmission time interval, that is, perform sampling on the signals. (4) Decode the waveform obtained after cutting based on a decoding algorithm.

Figure 9:
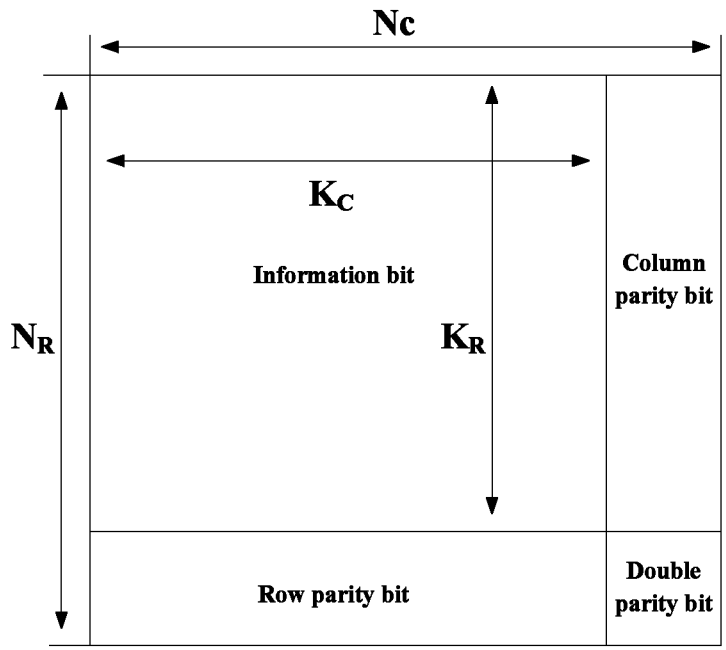
FIG. 9 is an optional two-dimensional TPC encoding diagram according to an embodiment of the present disclosure.

Specifically, the error-correcting code encoding may be precoding by using an error-correcting code, for example, FEC encoding. A purpose of the precoding is to perform preliminary encoding on an input bit stream. The precoding can improve an information flow error-correcting capability, reduce a system bit error rate, provide a relatively high code rate, and improve reliability of an information bit stream. There are a plurality of precoding methods, including using a convolutional code, a turbo code, a turbo product code (Turbo Product Code, TPC), and the like. In this embodiment of the present disclosure, the TPC is used as an example to describe a precoding process. The TPC is a type of turbo code. TPC encoding is actually an array turbo encoding, including two component encoders: a row and a column, forming a two-dimensional TPC. A component code thereof may be a convolutional code, or may be a simple block code such as a Hamming code, a BCH code, or a parity check code. A TPC encoding array may be further expanded to three dimensions or more. For example, diagonal encoding is further added based on two-dimensional row/column encoding, and one row or column of parity bit information is further added in the matrix, as shown in FIG. 9. A TPC encoding process mainly includes three steps: (1) First, place information bits in a $K_C*K_R$ matrix. (2) Encode $K_C$ bits in each row into a codeword with a length of $N_C$. (3) Encode $K_R$ bits in each column into a codeword with a length of $N_R$. (4) Output an encoded $N_C*N_R$ codeword matrix by column to complete the encoding process. A code rate of TPC encoding is $$r = \frac{K_C * K_R}{N_C * N_R}.$$

The TPC encoding is highly flexible. Because a minimum Hamming distance of the TPC is equal to a product of minimum Hamming distances of component codes, superb performance can be achieved when a simple Hamming code is used as the TPC. For example, an extension (64, 57) Hamming code that can be used to correct only one error can be used to construct a TPC (64, 57) whose performance is comparable to that of a turbo code. Such encoding provides not only superb error-correcting performance, but also a relatively high code rate.

Specifically, the first encoded information may be channel-I encoded information, and the second encoded information may be channel-Q encoded information.

Figure 10:
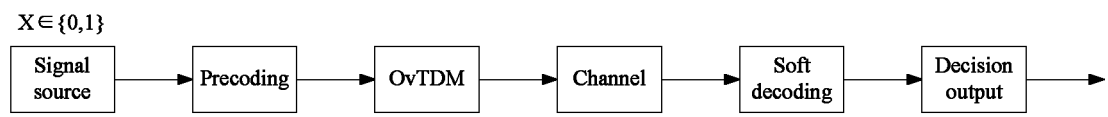
FIG. 10 is an optional schematic diagram of a transmit end of an OvTDM system according to an embodiment of the present disclosure.
Figure 11:
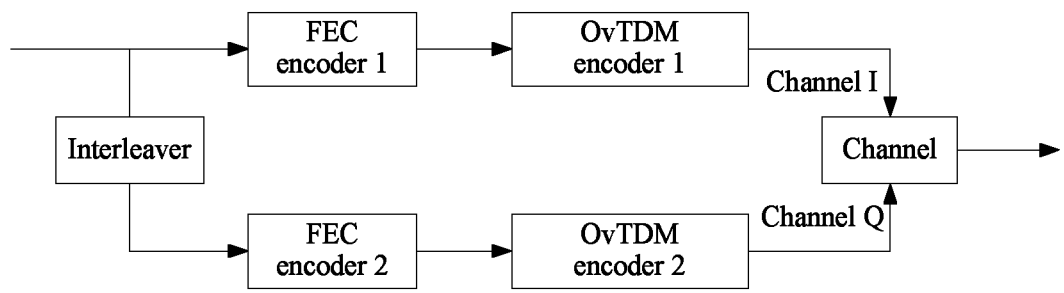
FIG. 11 is another optional schematic diagram of a transmit end of an OvTDM system according to an embodiment of the present disclosure.
Figure 12:
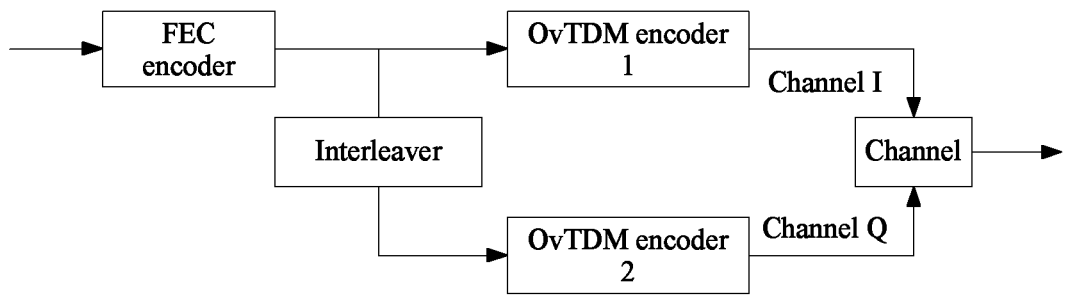
FIG. 12 is still another optional schematic diagram of a transmit end of an OvTDM system according to an embodiment of the present disclosure.

In an optional solution, as shown in FIG. 10, the transmit end may add a precoding process before OvTDM encoding, where an error-correcting code may be used to perform precoding. In another optional solution, as shown in FIG. 11, the transmit end may add a precoding process before OvTDM encoding, for example, add an FEC encoding process. An input information flow passes through an interleaver, and undergoes FEC encoding and OvTDM encoding, to form channel-I and channel-Q data transmission. In still another optional solution, as shown in FIG. 12, the transmit end may add a precoding process before an OvTDM system, for example, add an FEC encoding process. Input information is precoded; a precoded information flow is divided into two information flows, where one of the information flows passes through an interleaver; and the information flows separately undergo OvTDM encoding, to form channel-I and channel-Q data transmission. After obtaining the encoded information by performing overlapped multiplexing encoding and error-correcting code encoding on the input information, the transmit end may transmit the encoded information to a receive end through a channel.

Step S104: Decode the encoded information according to an overlapped multiplexing decoding algorithm, to obtain a first decoding result.

Specifically, the overlapped multiplexing decoding algorithm may be an OvXDM decoding algorithm. In this embodiment of the present disclosure, the OvTDM system is used as an example for detailed description. Because the OvTDM system performs decoding in combination with an error-correcting code, an OvTDM decoding output result needs to be a soft value. Common decoding algorithms include a BCJR algorithm, a long-MAP algorithm, and the like.

Step S106: Perform error-correcting processing on the first decoding result according to an error-correcting code decoding algorithm, to obtain a second decoding result.

Specifically, the error-correcting code decoding algorithm may be a forward error correction FEC (Forward Error Correction) decoding algorithm. FEC is a method for enhancing data communication reliability and a method for transmitting redundant information by using data. When an error occurs during transmission, a receiver is allowed to rebuild data. There are many common FEC decoding methods, including soft-input soft-output TPC and LDPC methods and the like. In this embodiment of the present disclosure, the TPC is used as an example for description. Received data may be first decoded, and then column decoding is performed to exchange respective soft information.

Step S108: Output the second decoding result.

In an optional solution, after receiving, through the channel, the encoded information sent by the transmit end, the receive end may combine OvTDM decoding with error-correcting code decoding; first perform OvTDM decoding on the encoded information to obtain the first decoding result; perform error-correcting processing by using the first decoding result as extrinsic information, to correct incorrect information into correct information, that is, perform FEC decoding, to obtain the second decoding result; and output the second decoding result. In an ideal status, the second decoding result is the same as the input information at the transmit end. However, due to a performance difference between decoding schemes, there is a deviation, that is, a commonly called error code, between the output result and the input information.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Optionally, in the foregoing embodiment of the present disclosure, before outputting the second decoding result in step S108, the method includes the following steps:

Step S110: Determine whether the second decoding result meets a preset condition.

Specifically, the preset condition may be an iteration condition specified according to complexity and performance requirements of the overlapped multiplexing system, for example, may be that the second decoding result meets a convergence condition, or may be that a quantity of iterations meets an iteration requirement.

Step S112: If the second decoding result meets the preset condition, output the second decoding result.

In an optional solution, if the second decoding result obtained through decoding in a current iteration process meets the preset condition, the iteration process ends, and the second decoding result is output.

Step S114: If the second decoding result does not meet the preset condition, obtain feedback information according to the second decoding result.

Step S116: Decode the encoded information and the feedback information according to the overlapped multiplexing decoding algorithm, to obtain a third decoding result.

Step S118: Perform error-correcting processing on the third decoding result according to the error-correcting code decoding algorithm, to obtain a fourth decoding result.

Step S120: Use the fourth decoding result as the second decoding result, and return to perform step S110 of determining whether the second decoding result meets the preset condition.

In an optional solution, if the second decoding result obtained through decoding in the current iteration process does not meet the preset condition, the iteration process needs to continue. The feedback information may be obtained according to the second decoding result, and may be used as input for a next iteration process to perform OvTDM decoding to obtain the third decoding result; error-correcting processing is performed on the third decoding result, that is, FEC decoding is performed, to obtain the fourth decoding result; it is determined whether the fourth decoding result meets the preset condition; and if the fourth decoding result meets the preset condition, the iteration process ends, and the fourth decoding result is output; or if the fourth decoding result does not meet the preset condition, iteration continues, and feedback information for a next iteration process is obtained according to the fourth decoding result.

Figure 13:
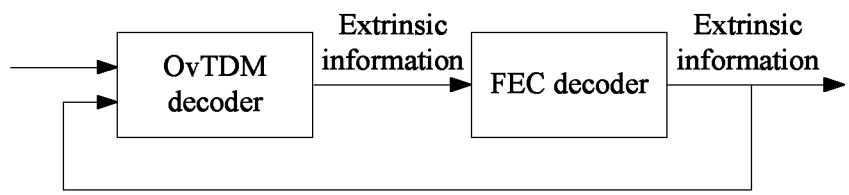
FIG. 13 is an optional schematic diagram of a receive end of an OvTDM system according to an embodiment of the present disclosure.

For example, for the structural block diagram of the transmit end in FIG. 10, a structural block diagram of the receive end may be shown in FIG. 13. After receiving the encoded information, the receive end may use the encoded information as input of an OvTDM decoder to perform OvTDM decoding to obtain the first decoding result; perform error-correcting processing by using the first decoding result as extrinsic information, that is, input the first decoding result into an FEC decoder to perform FEC decoding to obtain the second decoding result; if the second decoding result does not meet the preset condition, use the second decoding result as extrinsic information, that is, feedback information, and use the feedback information and the encoded information as input of the OvTDM decoder to repeat the foregoing decoding process, until the second decoding result meets the preset condition; and output the second decoding result.

Optionally, in the foregoing embodiment of the present disclosure, the determining whether the second decoding result meets the preset condition in step S110 includes the following steps:

Step S1102: Obtain a current quantity of iterations.

Step S1104: Determine whether the current quantity of iterations exceeds a preset quantity of iterations.

Specifically, selection of the preset quantity of iterations is related to a quantity K of overlapping times, a signal-to-noise ratio, and the like. When the quantity of iterations is excessively small, a system decoding result is inaccurate, and a bit error rate is slightly high; or when the quantity of overlapping times is relatively large, complexity is relatively high because a computation amount is excessively large. In this embodiment of the present disclosure, a selected preset quantity of iterations is 60.

Step S1106: If the current quantity of iterations exceeds the preset quantity of iterations, determine that the second decoding result meets the preset condition.

Step S1108: If the current quantity of iterations is less than the preset quantity of iterations, determine that the second decoding result does not meet the preset condition.

In an optional solution, after OvTDM decoding and FEC decoding are performed, it may be determined whether the current quantity of iterations reaches the preset quantity of iterations; and if the current quantity of iterations reaches the preset quantity of iterations, a decoding result obtained through decoding in a current iteration process is output; or if the current quantity of iterations does not reach the preset quantity of iterations, iteration continues, and feedback information for a next iteration process is obtained according to the decoding result obtained through decoding in the current iteration process.

Optionally, in the foregoing embodiment of the present disclosure, obtaining the feedback information according to the second decoding result in step S114 includes the following step:

Step S1142: Use the second decoding result as the feedback information.

In an optional solution, the second decoding result obtained through current decoding may be directly used as input for a next iteration process to perform OvTDM decoding.

Optionally, in the foregoing embodiment of the present disclosure, the decoding the encoded information according to the overlapped multiplexing decoding algorithm, to obtain the first decoding result in step S104 includes the following steps:

Step S1040: Decode the first encoded information according to a first overlapped multiplexing decoding algorithm, to obtain a fifth decoding result.

Step S1041: Perform error-correcting processing on the fifth decoding result according to a first error-correcting code decoding algorithm, to obtain a sixth decoding result.

Step S1042: Perform interleaving processing on the sixth decoding result according to a first interleaving algorithm, to obtain a first interleaving result.

Specifically, interleaving is a technology used for data processing in a communications system, with a purpose to maximally scatter centralized errors that burst during channel transmission, that is, disorganize all data without changing data content. Generally used interleaving algorithms include irregular interleaving, random interleaving, S interleaving, 64*64 array interleaving, and the like. Different interleaving methods impose different impact on system performance. In this embodiment of the present disclosure, an example in which the first interleaving algorithm is the S interleaving or random interleaving is used for description.

Step S1043: Decode the second encoded information and the first interleaving result according to a second overlapped multiplexing decoding algorithm, to obtain the first decoding result.

In an optional solution, to reduce complexity in a decoding process, interleaving, FEC decoding, and OvTDM decoding may be combined. For the structural block diagram of the transmit end in FIG. 11, a structural block diagram of the receive end may be shown in FIG. 14. After receiving the channel-I encoded information and the channel-Q encoded information, the receive end may use the channel-I encoded information as input of an OvTDM decoder 1 to perform first OvTDM decoding to obtain the fifth decoding result; perform first error-correcting processing by using the fifth decoding result as extrinsic information, that is, input the fifth decoding result into an FEC decoder 1 to perform first FEC decoding to obtain the sixth decoding result; use the sixth decoding result as extrinsic information, and input the sixth decoding result into an interleaver to perform interleaving to obtain the first interleaving result; and continue to input the first interleaving result into an OvTDM decoder 2 to perform second OvTDM decoding to obtain the first decoding result.

Optionally, in the foregoing embodiment of the present disclosure, performing error-correcting processing on the first decoding result according to the error-correcting code decoding algorithm, to obtain the second decoding result in step S106 includes the following step:

Step S1062: Perform error-correcting processing on the first decoding result according to a second error-correcting code decoding algorithm, to obtain the second decoding result.

Figure 14:
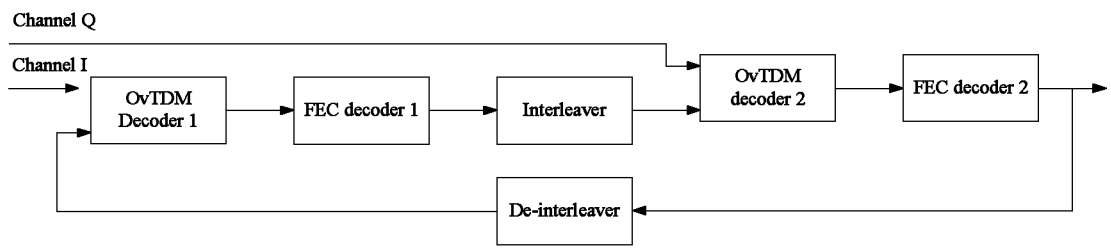
FIG. 14 is another optional schematic diagram of a receive end of an OvTDM system according to an embodiment of the present disclosure.

In an optional solution, as shown in FIG. 14, the first decoding result may be used as extrinsic information to perform second error-correcting processing, that is, the first decoding result is input into an FEC decoder 2 to perform second FEC decoding to obtain the second decoding result.

Optionally, in the foregoing embodiment of the present disclosure, obtaining the feedback information according to the second decoding result in step S114 includes the following step:

Step S1144: Perform de-interleaving processing on the second decoding result according to a first de-interleaving algorithm, to obtain the feedback information, where the first de-interleaving algorithm is an inverse algorithm of the first interleaving algorithm.

In an optional solution, as shown in FIG. 14, if the second decoding result does not meet the preset condition, the second decoding result may be input into a de-interleaver to perform de-interleaving processing and then this obtain extrinsic information of the channel-Q encoded information, that is, the feedback information, where de-interleaving and interleaving are inverse processes.

It should be noted that, as shown in FIG. 14, after second time iteration is performed, extrinsic information, that is, feedback information, of the channel-I encoded information and the channel-Q encoded information may be used as input of the OvTDM decoder 1 to repeat the foregoing decoding process, until the second decoding result meets the preset condition. Then iteration ends, and the second decoding result is output.

Optionally, in the foregoing embodiment of the present disclosure, decoding the encoded information according to the overlapped multiplexing decoding algorithm, to obtain the first decoding result in step S104 includes the following steps:

Step S1044: Decode the first encoded information according to a third overlapped multiplexing decoding algorithm, to obtain a seventh decoding result.

Step S1045: Perform error-correcting processing on the seventh decoding result according to the error-correcting code decoding algorithm, to obtain an eighth decoding result.

Step S1046: Perform interleaving processing on the eighth decoding result according to a second interleaving algorithm, to obtain a second interleaving result.

Step S1047: Decode the second encoded information and the second interleaving result according to a fourth overlapped multiplexing decoding algorithm, to obtain a ninth decoding result.

Step S1048: Perform de-interleaving processing on the ninth decoding result according to a second de-interleaving algorithm, to obtain the first decoding result, where the second de-interleaving algorithm is an inverse algorithm of the second interleaving algorithm.

In an optional solution, to reduce complexity in a decoding process, interleaving, FEC decoding, and OvTDM decoding may be combined. For the structural block diagram of the transmit end in FIG. 12, a structural block diagram of the receive end may be shown in FIG. 15. After receiving the channel-I encoded information and the channel-Q encoded information, the receive end may use the channel-I encoded information as input of an OvTDM decoder 1 to perform first OvTDM decoding to obtain the seventh decoding result; perform first error-correcting processing by using the seventh decoding result as extrinsic information, that is, input the seventh decoding result into an FEC decoder to perform first FEC decoding to obtain the eighth decoding result; use the eighth decoding result as extrinsic information, and input the eighth decoding result into an interleaver to perform interleaving to obtain the second interleaving result; continue to input the second interleaving result into an OvTDM decoder 2 to perform second OvTDM decoding to obtain the ninth decoding result; and then further use the ninth decoding result as extrinsic information, and input the ninth decoding result into a de-interleaver to perform de-interleaving to obtain the first decoding result.

Figure 15:
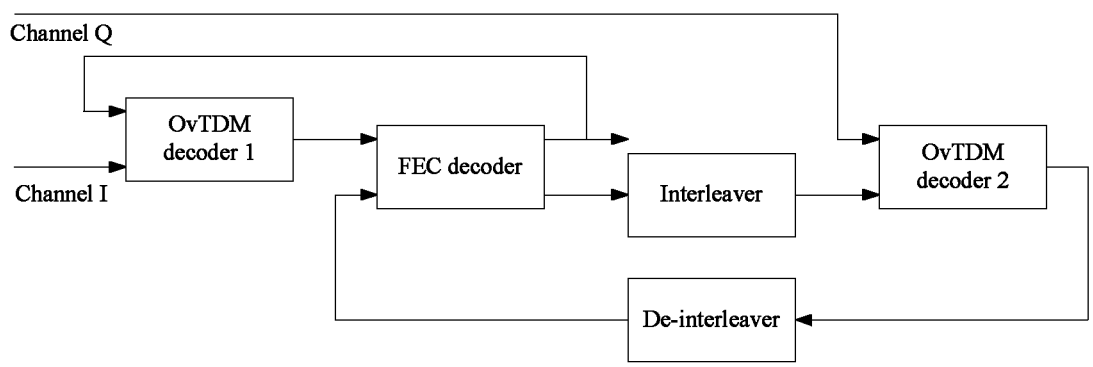
FIG. 15 is another optional schematic diagram of a receive end of an OvTDM system according to an embodiment of the present disclosure.

It should be noted that, as shown in FIG. 15, after the first decoding result is obtained, the first decoding result may be further input into the FEC decoder to perform second error-correcting processing, that is, perform second FEC decoding, to obtain the second decoding result; if the second decoding result does not meet the preset condition, the second decoding result may be used as extrinsic information, that is, feedback information, of the channel-Q encoded information, and the feedback information and the channel-I encoded information are input into the OvTDM decoder 1 to repeat the foregoing decoding process, until the second decoding result meets the preset condition; and then iteration ends, and the second decoding result is output.

Optionally, in the foregoing embodiment of the present disclosure, after receiving the encoded information output by the transmit end in step S102, the method further includes the following step:

Step S122: Perform preprocessing on the encoded information, to obtain processed encoded information.

In an optional solution, after receiving the encoded information by using an antenna, the receive end may first perform preprocessing on the encoded information, where the preprocessing may include operations such as synchronization, channel estimation, and equalization, to obtain the processed encoded information; and then perform OvTDM decoding and FEC decoding on the processed encoded information.

The following describes a preferred embodiment of the present disclosure in detail with reference to FIG. 13. As shown in FIG. 13, it is assumed that an input information sequence is X, a length is N=100, a quantity of times of overlapped multiplexing is K=5, a multiplexing waveform is a Chebyshev window, and an error-correcting code is a TPC. A transmit end first performs TPC precoding on the input information X, then performs encoding in an OvTDM system, and transmits an encoded signal by using an antenna. The signal is transmitted through a channel. A receive end receives a signal Y by using an antenna; first performs a series of processing on the signal, including operations such as synchronization, channel estimation, and equalization, to obtain a signal Y'; and then decodes the signal Y'. Decoding steps are as follows: (1) Set an item of a quantity of iterations. (2) Use Y' as input information of an OvTDM decoder to perform OvTDM decoding to obtain a first decoding result. (3) Use the first decoding result obtained in (2) as extrinsic information to perform FEC decoding to obtain a second decoding result. (4) Use the second decoding result obtained in (3) as input information of the OvTDM decoder to repeat steps (2) and (3), until a specific condition is met or the quantity of iterations is reached; and then end iteration. (5) Output a decoding result X.

The following describes another preferred embodiment of the present disclosure in detail with reference to FIG. 14. As shown in FIG. 14, it is assumed that an input information sequence is X, a length is N=100, a quantity of times of overlapped multiplexing is K=5, a multiplexing waveform is a Chebyshev window, and an error-correcting code is a TPC. A transmit end first performs TPC precoding on the input information X, then performs encoding in an OvTDM system, and transmits an encoded signal by using an antenna. The signal is transmitted through a channel. A receive end receives a signal Y by using an antenna; first performs a series of processing on the signal, including operations such as synchronization, channel estimation, and equalization, to obtain a signal Y'; and then decodes the signal Y', where Y' includes channel-I data and channel-Q data. Decoding steps are as follows: (1) Set an item of a quantity of iterations. (2) Use the channel-I data as input information of an OvTDM decoder 1 to perform first OvTDM decoding to obtain a fifth decoding result. (3) Use the fifth decoding result obtained in (2) as extrinsic information, and input the fifth decoding result into an FEC decoder 1 to perform first FEC decoding to obtain a sixth decoding result. (4) Use the sixth decoding result obtained in (3) as extrinsic information, and input the sixth decoding result into an interleaver to perform interleaving to obtain a first interleaving result. (5) Continue to input the first interleaving result obtained in (4) into an OvTDM decoder 2 to perform a second OvTDM decoding operation, and input the channel-Q data into the OvTDM decoder 2 to perform OvTDM decoding, to obtain a first decoding result. (6) Use the first decoding result obtained in (5) as extrinsic information, and input the first decoding result into an FEC decoder 2 to perform second FEC decoding to obtain a second decoding result. (7) Perform de-interleaving on the second decoding result obtained in (6) to obtain a first de-interleaving result. (8) Use the first de-interleaving result obtained in (7) as input information of the OvTDM decoder 1 to repeat steps (2) to (7), until a specific condition is met or the quantity of iterations is reached; and then end iteration. (9) Output a decoding result X.

The following describes another preferred embodiment of the present disclosure in detail with reference to FIG. 15. As shown in FIG. 15, it is assumed that an input information sequence is X, a length is N=100, a quantity of times of overlapped multiplexing is K=5, a multiplexing waveform is a Chebyshev window, and an error-correcting code is a TPC. A transmit end first performs TPC precoding on the input information X, then performs encoding in an OvTDM system, and transmits an encoded signal by using an antenna. The signal is transmitted through a channel. A receive end receives a signal Y by using an antenna; first performs a series of processing on the signal, including operations such as synchronization, channel estimation, and equalization, to obtain a signal Y'; and then decodes Y', where Y' includes channel-I data and channel-Q data. Decoding steps are as follows: (1) Set an item of a quantity of iterations. (2) Use the channel-I data as input information of an OvTDM decoder 1 to perform first OvTDM decoding to obtain a seventh decoding result. (3) Use the seventh decoding result obtained in (2) as extrinsic information, and input the seventh decoding result into an FEC decoder to perform first FEC decoding to obtain an eighth decoding result. (4) Use the eighth decoding result obtained in (3) as extrinsic information, and input the eighth decoding result into an interleaver to perform interleaving to obtain a second interleaving result. (5) Continue to input the second interleaving result obtained in (4) into an OvTDM decoder 2 to perform second OvTDM decoding, and input the channel-Q data into the OvTDM decoder 2 to perform an OvTDM decoding operation, to obtain a ninth decoding result. (6) Perform de-interleaving on the ninth decoding result obtained in (5) to obtain a second de-interleaving result. (7) Use the second de-interleaving result obtained in (6) as extrinsic information, and input the second de-interleaving result into the FEC decoder to perform second FEC decoding to obtain a second decoding result. (8) Use the second decoding result obtained in (7) as input of (2) to repeat steps (2) to (7), until a specific condition is met or the quantity of iterations is reached; and then end iteration. (9) Output a decoding result X.

According to the foregoing embodiment, FEC decoding is combined with OvTDM decoding. This improves an error-correcting capability of the overlapped multiplexing system, reduces a bit error rate of the overlapped multiplexing system, and improves reliability of the overlapped multiplexing system. A relatively low bit error rate can be achieved at a relatively low signal-to-noise ratio under high spectrum efficiency. In addition, because both the channel-I transmitted data and the channel-Q transmitted data are introduced in the system, reliability of the overlapped multiplexing system is also improved.

Figure 16:
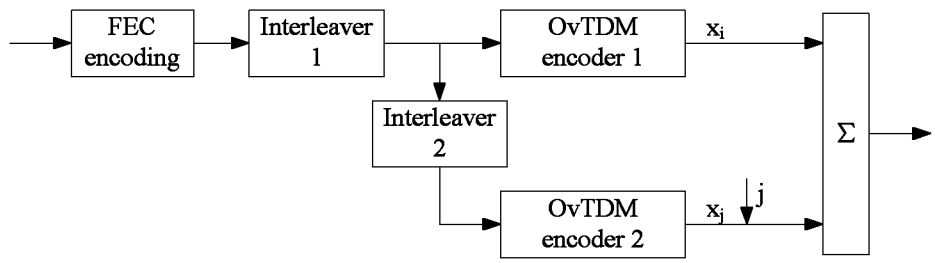
FIG. 16 is another optional schematic diagram of a transmit end of an OvTDM system according to an embodiment of the present disclosure.
Figure 17:
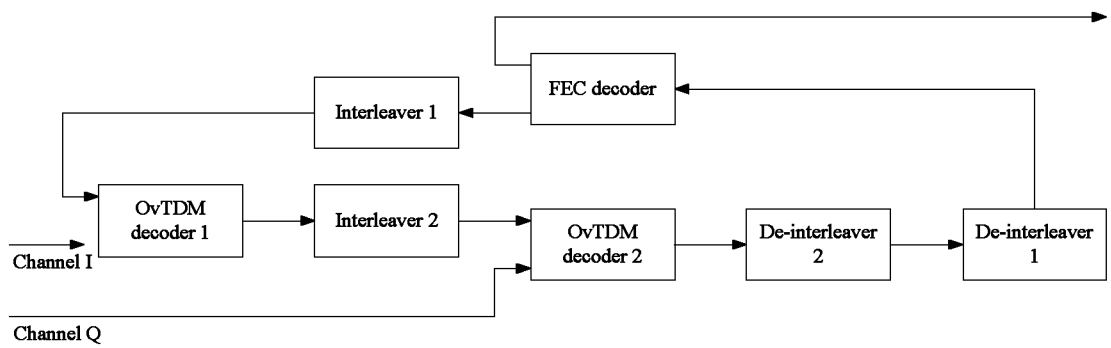
FIG. 17 is another optional schematic diagram of a receive end of an OvTDM system according to an embodiment of the present disclosure.
Figure 18:
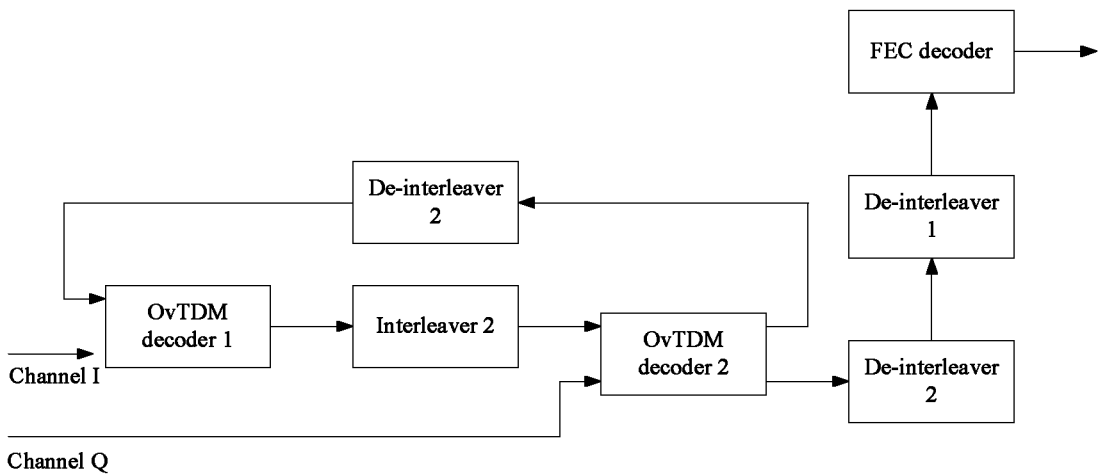
FIG. 18 is another optional schematic diagram of a receive end of an OvTDM system according to an embodiment of the present disclosure.

Herein, it should be noted that, the structural block diagram of the transmit end and the structural block diagram of the receive end in the foregoing embodiments of the present disclosure are relatively flexible. A structure shown in FIG. 16 may also be used for the transmit end. Correspondingly, a structure shown in FIG. 17 or FIG. 18 may be used for the receive end. Both structures can implement a decoding function, but a result is not limited thereto.

In addition, it should be further noted that, the foregoing embodiments of the present disclosure may be applied to not only the OvXDM system, but also an actual mobile communications system, such as a TD-LTE system or a TD-SCDMA system; and may also be widely applied to any wireless communications system, such as satellite communications, microwave line-of-sight communications, scatter communications, atmospheric optical communications, infrared communications, or underwater acoustic communications. The embodiments may be applied to large-capacity wireless transmission, and may also be applied to a small-capacity lightweight radio system.

Embodiment 2

According to this embodiment of the present disclosure, an embodiment of a processing device for an overlapped multiplexing system is provided.

Figure 19:
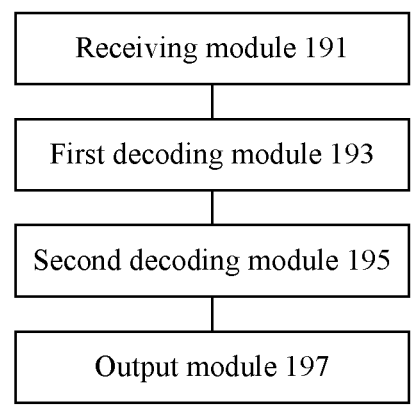
FIG. 19 is a schematic diagram of a processing device for an overlapped multiplexing system according to an embodiment of the present disclosure.

FIG. 19 is a schematic diagram of a processing device for an overlapped multiplexing system according to an embodiment of the present disclosure. As shown in FIG. 19, the device includes a receiving module 191, a first decoding module 193, a second decoding module 195, and an output module 197.

The receiving module 191 is configured to receive encoded information output by a transmit end, where the encoded information is information obtained by performing error-correcting code encoding and overlapped multiplexing encoding on input information.

Specifically, the overlapped multiplexing encoding may be OvXDM encoding. In this embodiment of the present disclosure, an OvTDM system is used as an example for detailed description. A block diagram of a transmit signal of an OvTDM system is shown in FIG. 2. Specific steps are as follows: (1) First, generate a transmit signal envelope waveform h(t) through design. (2) Perform a specific time shift on the envelope waveform h(t) designed in (1), to form transmit signal envelope waveforms h(t−i×ΔT) of other moments. (3) Multiply a to-be-sent symbol $x_i$ by an envelope waveform h(t−i×ΔT) of a corresponding moment that is generated in (2), to obtain to-be-sent signal waveforms $x_i$h(t−i×ΔT) of the moments. (4) Overlap the to-be-sent signal waveforms $x_i$h (t−i×ΔT) formed in (3), to form a transmit signal waveform. (5) The transmit signal may be represented as follows:

$$s(t) = \sum_i x_i h(t - i \times \Delta T),$$

where the to-be-sent symbol ⃞ corresponds to an input data sequence $P_i$ in 1. A block diagram of an OvTDM received signal is shown in FIG. 4. Multiplexing of K waveforms is shown in FIG. 5. An input-output relationship diagram of an OvTDM system is shown in FIG. 6. A trellis diagram of an OvTDM system is shown in FIG. 8. The transmit end transmits an encoded and modulated signal by using an antenna. The signal is transmitted in a wireless channel. A receive end first performs preprocessing on the received signal, then performs matching and filtering on the received signal, then performs sampling and decoding on the signal, and finally performs decision and outputs a bit stream. Specific steps are as follows: (1) First, synchronize received signals, including carrier synchronization, frame synchronization, symbol time synchronization, and the like. (2) Perform digital processing on received signals in each frame based on a sampling theorem. (3) Cut a received waveform based on a waveform transmission time interval, that is, perform sampling on the signals. (4) Decode the waveform obtained after cutting based on a decoding algorithm.

Specifically, the error-correcting code encoding may be precoding by using an error-correcting code. A purpose of the precoding is to perform preliminary encoding on an input bit stream. The precoding can improve an information flow error-correcting capability, reduce a system bit error rate, provide a relatively high code rate, and improve reliability of an information bit stream. There are a plurality of precoding methods, including a convolutional code, a turbo code, a turbo product code (Turbo Product Code, TPC), and the like. In this embodiment of the present disclosure, the TPC is used as an example to describe a precoding process. The TPC is a type of turbo code. TPC encoding is actually an array turbo encoding, including two component encoders: a row and a column, forming a two-dimensional TPC. A component code thereof may be a convolutional code, or may be a simple block code such as a Hamming code, a BCH code, or even a parity check code. A TPC encoding array may be further expanded to three dimensions or more. For example, diagonal encoding is further added based on two-dimensional row/column encoding, and one row or column of parity bit information is further added in the matrix, as shown in FIG. 8. A TPC encoding process mainly includes three steps: (1) First, place information bits in a $K_C*K_R$ matrix. (2) Encode $K_C$ bits in each row into a codeword with a length of $N_C$. (3) Encode $K_R$ bits in each column into a codeword with a length of $N_R$. (4) Output an encoded $N_C*N_R$ codeword matrix by column to complete the encoding process. A code rate of TPC encoding is $$r = \frac{K_C * K_R}{N_C * N_R}.$$

The TPC encoding is highly flexible. Because a minimum Hamming distance of the TPC is equal to a product of minimum Hamming distances of component codes, superb performance can be achieved when a simple Hamming code is used as the TPC. For example, an extension (64, 57) Hamming code that can be used to correct only one error can be used to construct a TPC (64, 57) whose performance compares with that of a turbo code. Such encoding provides not only superb error-correcting performance, but also a relatively high code rate.

Optionally, in the foregoing embodiment of the present disclosure, the encoded information includes first encoded information and second encoded information, where the first encoded information and the second encoded information have a same symbol length. Specifically, the first encoded information may be channel-I encoded information, and the second encoded information may be channel-Q encoded information.

The first decoding module 193 is configured to: decode the encoded information according to an overlapped multiplexing decoding algorithm, to obtain a first decoding result.

Specifically, the overlapped multiplexing decoding algorithm may be an OvXDM decoding algorithm. In this embodiment of the present disclosure, the OvTDM system is used as an example for detailed description. Because the OvTDM system performs decoding in combination with an error-correcting code, an OvTDM decoding output result needs to be a soft value. Common decoding algorithms include a BCJR algorithm, a long-MAP algorithm, and the like.

The second decoding module 195 is configured to: perform error-correcting processing on the first decoding result according to an error-correcting code decoding algorithm, to obtain a second decoding result.

Specifically, the error-correcting code decoding algorithm may be a forward error correction FEC (Forward Error Correction) decoding algorithm. FEC is a method for enhancing data communication reliability and a method for transmitting redundant information by using data. When an error occurs during transmission, a receiver is allowed to rebuild data. There are many common FEC decoding methods, including soft-input soft-output TPC and LDPC methods and the like. In this embodiment of the present disclosure, the TPC is used as an example for description. Received data may be first decoded, and then column decoding is performed to exchange respective soft information.

The output module 197 is configured to: output the second decoding result.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Optionally, in the foregoing embodiment of the present disclosure, the device further includes: a judgment module, configured to: determine whether the second decoding result meets a preset condition, where the output module 197 is further configured to: if the second decoding result meets the preset condition, output the second decoding result; a first processing module, configured to: if the second decoding result does not meet the preset condition, obtain feedback information according to the second decoding result; a third decoding module, configured to: decode the encoded information and the feedback information according to the overlapped multiplexing decoding algorithm, to obtain a third decoding result; a fourth decoding module, configured to: perform error-correcting processing on the third decoding result according to the error-correcting code decoding algorithm, to obtain a fourth decoding result; and a second processing module, configured to: use the fourth decoding result as the second decoding result, and return to perform the function of the judgment module.

Optionally, in the foregoing embodiment of the present disclosure, the judgment module includes: an obtaining submodule, configured to: obtain a current quantity of iterations; a judgment submodule, configured to: determine whether the current quantity of iterations exceeds a preset quantity of iterations; a first determining submodule, configured to: if the current quantity of iterations exceeds the preset quantity of iterations, determine that the second decoding result meets the preset condition; and a second determining submodule, configured to: if the current quantity of iterations is less than the preset quantity of iterations, determine that the second decoding result does not meet the preset condition.

Optionally, in the foregoing embodiment of the present disclosure, the first processing module is further configured to: use the second decoding result as the feedback information.

Optionally, in the foregoing embodiment of the present disclosure, the first decoding module 193 includes: a first decoding submodule, configured to: decode the first encoded information according to a first overlapped multiplexing decoding algorithm, to obtain a fifth decoding result; a second decoding submodule, configured to: perform error-correcting processing on the fifth decoding result according to a first error-correcting code decoding algorithm, to obtain a sixth decoding result; a first interleaving submodule, configured to: perform interleaving processing on the sixth decoding result according to a first interleaving algorithm, to obtain a first interleaving result; and a third decoding submodule, configured to: decode the second encoded information and the first interleaving result according to a second overlapped multiplexing decoding algorithm, to obtain the first decoding result.

Optionally, in the foregoing embodiment of the present disclosure, the second decoding module 195 is further configured to: perform error-correcting processing on the first decoding result according to a second error-correcting code decoding algorithm, to obtain the second decoding result.

Optionally, in the foregoing embodiment of the present disclosure, the first processing module includes: a first de-interleaving submodule, configured to: perform de-interleaving processing on the second decoding result according to a first de-interleaving algorithm, to obtain the feedback information, where the first de-interleaving algorithm is an inverse algorithm of the first interleaving algorithm.

Optionally, in the foregoing embodiment of the present disclosure, the first decoding module 193 includes: a fourth decoding submodule, configured to: decode the first encoded information according to a third overlapped multiplexing decoding algorithm, to obtain a seventh decoding result; a fifth decoding submodule, configured to: perform error-correcting processing on the seventh decoding result according to the error-correcting code decoding algorithm, to obtain an eighth decoding result; a second interleaving submodule, configured to: perform interleaving processing on the eighth decoding result according to a second interleaving algorithm, to obtain a second interleaving result; a sixth decoding submodule, configured to: decode the second encoded information and the second interleaving result according to a fourth overlapped multiplexing decoding algorithm, to obtain a ninth decoding result; and a second de-interleaving submodule, configured to: perform de-interleaving processing on the ninth decoding result according to a second de-interleaving algorithm, to obtain the first decoding result, where the second de-interleaving algorithm is an inverse algorithm of the second interleaving algorithm.

Optionally, in the foregoing embodiment of the present disclosure, the device further includes: a third processing module, configured to: perform preprocessing on the encoded information, to obtain processed encoded information.

It should be noted that, for preferred implementations of this embodiment, reference may be made to the related descriptions in Embodiment 1. Details are not described herein again.

Embodiment 3

According to this embodiment of the present disclosure, an embodiment of a processing system for an overlapped multiplexing system is provided.

Figure 20:
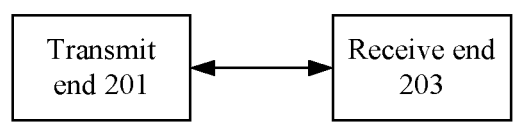
FIG. 20 is a schematic diagram of a processing system for an overlapped multiplexing system according to an embodiment of the present disclosure.

FIG. 20 is a schematic diagram of a processing system for an overlapped multiplexing system according to an embodiment of the present disclosure. As shown in FIG. 20, the system includes a transmit end 201 and a receive end 203.

The transmit end 201 is configured to: output encoded information, where the encoded information is information obtained by performing error-correcting code encoding and overlapped multiplexing encoding on input information.

Specifically, the overlapped multiplexing encoding may be OvXDM encoding. In this embodiment of the present disclosure, an OvTDM system is used as an example for detailed description. A block diagram of a transmit signal of an OvTDM system is shown in FIG. 2. Specific steps are as follows: (1) First, generate a transmit signal envelope waveform h(t) through design. (2) Perform a specific time shift on the envelope waveform h(t) designed in (1), to form transmit signal envelope waveforms h(t−i×ΔT) of other moments. (3) Multiply a to-be-sent symbol $x_i$ by an envelope waveform h(t−i×ΔT) of a corresponding moment that is generated in (2), to obtain to-be-sent signal waveforms $x_i$h(t−i×ΔT) of the moments. (4) Overlap the to-be-sent signal waveforms $x_i$h (t−i×ΔT) formed in (3), to form a transmit signal waveform. (5) The transmit signal may be represented as follows:

$$s(t) = \sum_i x_i h(t - i \times \Delta T),$$

where the to-be-sent symbol ▣ corresponds to an input data sequence $P_t$ in 1. A block diagram of an OvTDM received signal is shown in FIG. 4. Multiplexing of K waveforms is shown in FIG. 5. An input-output relationship diagram of an OvTDM system is shown in FIG. 6. A trellis diagram of an OvTDM system is shown in FIG. 8. The transmit end transmits an encoded and modulated signal by using an antenna. The signal is transmitted in a wireless channel. A receive end first performs preprocessing on the received signal, then performs matching and filtering on the received signal, then performs sampling and decoding on the signal, and finally performs decision and outputs a bit stream. Specific steps are as follows: (1) First, synchronize received signals, including carrier synchronization, frame synchronization, symbol time synchronization, and the like. (2) Perform digital processing on received signals in each frame based on a sampling theorem. (3) Cut a received waveform based on a waveform transmission time interval, that is, perform sampling on the signals. (4) Decode the waveform obtained after cutting based on a decoding algorithm.

Specifically, the error-correcting code encoding may be precoding by using an error-correcting code. A purpose of the precoding is to perform preliminary encoding on an input bit stream. The precoding can improve an information flow error-correcting capability, reduce a system bit error rate, provide a relatively high code rate, and improve reliability of an information bit stream. There are a plurality of precoding methods, including a convolutional code, a turbo code, a turbo product code (Turbo Product Code, TPC), and the like. In this embodiment of the present disclosure, the TPC is used as an example to describe a precoding process. The TPC is a type of turbo code. TPC encoding is actually an array turbo encoding, including two component encoders: a row and a column, forming a two-dimensional TPC. A component code thereof may be a convolutional code, or may be a simple block code such as a Hamming code, a BCH code, or even a parity check code. A TPC encoding array may be further expanded to three dimensions or more. For example, diagonal encoding is further added based on two-dimensional row/column encoding, and one row or column of parity bit information is further added in the matrix, as shown in FIG. 8. A TPC encoding process mainly includes three steps: (1) First, place information bits in a $K_C * K_R$ matrix. (2) Encode $K_C$ bits in each row into a codeword with a length of $N_C$. (3) Encode $K_R$ bits in each column into a codeword with a length of $N_R$. (4) Output an encoded $N_C * N_R$ codeword matrix by column to complete the encoding process. A code rate of TPC encoding is $$r = \frac{K_C * K_R}{N_C * N_R}.$$

The TPC encoding is highly flexible. Because a minimum Hamming distance of the TPC is equal to a product of minimum Hamming distances of component codes, superb performance can be achieved when a simple Hamming code is used as the TPC. For example, an extension (64, 57) Hamming code that can be used to correct only one error can be used to construct a TPC (64, 57) whose performance compares with that of a turbo code. Such encoding provides not only superb error-correcting performance, but also a relatively high code rate.

Optionally, in the foregoing embodiment of the present disclosure, the encoded information includes first encoded information and second encoded information, where the first encoded information and the second encoded information have a same symbol length.

Specifically, the first encoded information may be channel-I encoded information, and the second encoded information may be channel-Q encoded information.

The receive end 203 has a communication relationship with the transmit end and is configured to: decode the encoded information according to an overlapped multiplexing decoding algorithm, to obtain a first decoding result; perform error-correcting processing on the first decoding result according to an error-correcting code decoding algorithm, to obtain a second decoding result; and output the second decoding result.

Specifically, the overlapped multiplexing decoding algorithm may be an OvXDM decoding algorithm. In this embodiment of the present disclosure, the OvTDM system is used as an example for detailed description. Because the OvTDM system performs decoding in combination with an error-correcting code, an OvTDM decoding output result needs to be a soft value. Common decoding algorithms include a BCJR algorithm, a long-MAP algorithm, and the like. The error-correcting code decoding algorithm may be a forward error correction FEC (Forward Error Correction) decoding algorithm. FEC is a method for enhancing data communication reliability and a method for transmitting redundant information by using data. When an error occurs during transmission, a receiver is allowed to rebuild data. There are many common FEC decoding methods, including soft-input soft-output TPC and LDPC methods and the like. In this embodiment of the present disclosure, the TPC is used as an example for description. Received data may be first decoded, and then column decoding is performed to exchange respective soft information.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Optionally, in the foregoing embodiment of the present disclosure, the receive end is further configured to: determine whether the second decoding result meets a preset condition; and if the second decoding result meets the preset condition, output the second decoding result; or if the second decoding result does not meet the preset condition, obtain feedback information according to the second decoding result; decode the encoded information and the feedback information according to the overlapped multiplexing decoding algorithm, to obtain a third decoding result; perform error-correcting processing on the third decoding result according to the error-correcting code decoding algorithm, to obtain a fourth decoding result; and use the fourth decoding result as the second decoding result, and return to perform the step of determining whether the second decoding result meets the preset condition.

Optionally, in the foregoing embodiment of the present disclosure, the receive end is further configured to: obtain a current quantity of iterations; determine whether the current quantity of iterations exceeds a preset quantity of iterations; and if the current quantity of iterations exceeds the preset quantity of iterations, determine that the second decoding result meets the preset condition; or if the current quantity of iterations is less than the preset quantity of iterations, determine that the second decoding result does not meet the preset condition.

Optionally, in the foregoing embodiment of the present disclosure, the receive end is further configured to: use the second decoding result as the feedback information.

Optionally, in the foregoing embodiment of the present disclosure, the receive end is further configured to: decode the first encoded information according to a first overlapped multiplexing decoding algorithm, to obtain a fifth decoding result; perform error-correcting processing on the fifth decoding result according to a first error-correcting code decoding algorithm, to obtain a sixth decoding result; perform interleaving processing on the sixth decoding result according to a first interleaving algorithm, to obtain a first interleaving result; and decode the second encoded information and the first interleaving result according to a second overlapped multiplexing decoding algorithm, to obtain the first decoding result.

Optionally, in the foregoing embodiment of the present disclosure, the receive end is further configured to: perform error-correcting processing on the first decoding result according to a second error-correcting code decoding algorithm, to obtain the second decoding result.

Optionally, in the foregoing embodiment of the present disclosure, the receive end is further configured to: perform de-interleaving processing on the second decoding result according to a first de-interleaving algorithm, to obtain the feedback information, where the first de-interleaving algorithm is an inverse algorithm of the first interleaving algorithm.

Optionally, in the foregoing embodiment of the present disclosure, the receive end is further configured to: decode the first encoded information according to a third overlapped multiplexing decoding algorithm, to obtain a seventh decoding result; perform error-correcting processing on the seventh decoding result according to the error-correcting code decoding algorithm, to obtain an eighth decoding result; perform interleaving processing on the eighth decoding result according to a second interleaving algorithm, to obtain a second interleaving result; decode the second encoded information and the second interleaving result according to a fourth overlapped multiplexing decoding algorithm, to obtain a ninth decoding result; and perform de-interleaving processing on the ninth decoding result according to a second de-interleaving algorithm, to obtain the first decoding result, where the second de-interleaving algorithm is an inverse algorithm of the second interleaving algorithm.

Optionally, in the foregoing embodiment of the present disclosure, the receive end is further configured to: perform preprocessing on the encoded information, to obtain processed encoded information.

It should be noted that, for preferred implementations of this embodiment, reference may be made to the related descriptions in Embodiment 1. Details are not described herein again.

Embodiment 4

According to an embodiment of the present disclosure, a storage medium is provided, where the storage medium includes a stored program, and when the program runs, a device on which the storage medium is located is controlled to perform the processing method for an overlapped multiplexing system according to any one of the implementations in Embodiment 1.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Embodiment 5

According to an embodiment of the present disclosure, a processor is provided, where the processor is configured to run a program, and when the program runs, the processing method for an overlapped multiplexing system according to any one of the implementations in Embodiment 1 is performed.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Embodiment 6

According to an embodiment of the present disclosure, a terminal is provided, including: a receiving device, configured to: receive encoded information output by a transmit end, where the encoded information is information obtained by performing error-correcting code encoding and overlapped multiplexing encoding on input information; and a storage medium, configured to: store a program, where the following processing steps are performed on data output by the receiving device when the program runs: decoding the encoded information according to an overlapped multiplexing decoding algorithm, to obtain a first decoding result; performing error-correcting processing on the first decoding result according to an error-correcting code decoding algorithm, to obtain a second decoding result; and outputting the second decoding result.

Specifically, the terminal may be a receive end.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Embodiment 7

According to an embodiment of the present disclosure, a terminal is provided, including: a receiving device, configured to: receive encoded information output by a transmit end, where the encoded information is information obtained by performing error-correcting code encoding and overlapped multiplexing encoding on input information; and a processor, where the processor runs a program, and when the program runs, the following processing steps are performed on data output by the receiving device: decoding the encoded information according to an overlapped multiplexing decoding algorithm, to obtain a first decoding result; performing error-correcting processing on the first decoding result according to an error-correcting code decoding algorithm, to obtain a second decoding result; and outputting the second decoding result.

Specifically, the terminal may be a receive end.

According to the foregoing embodiment of the present disclosure, the encoded information output by the transmit end is received; the encoded information is decoded according to the overlapped multiplexing decoding algorithm, to obtain the first decoding result; error-correcting processing is performed on the first decoding result according to the error-correcting code decoding algorithm, to obtain the second decoding result; and the second decoding result is output. It is easily noted that, because the receive end combines overlapped multiplexing decoding with error-correcting code decoding, an information flow error-correcting capability and reliability are improved, a system bit error rate is reduced, a relatively low bit error rate can be achieved at a relatively low signal-to-noise ratio under high spectrum efficiency, and two channels of transmitted data can be introduced to further improve reliability of the overlapped multiplexing system, thereby resolving the prior-art technical problem that an overlapped multiplexing system has a poor error-correcting capability, and consequently has low reliability.

Sequence numbers of the foregoing embodiments of the present disclosure are merely used for description, and do not indicate superiority or inferiority of the embodiments.

In the foregoing embodiments of the present disclosure, descriptions of the embodiments have respective emphases. For a part not described in detail in an embodiment, reference may be made to related descriptions in another embodiment.

In the several embodiments provided in this application, it should be understood that the disclosed technical content may be implemented in other manners. The described apparatus embodiments are merely examples. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections may be implemented by using some interfaces. The indirect couplings or communication connections between the units or modules may be implemented in electrical or other forms.

The units described as separate parts may or may not be physically separated, and parts shown as units may or may not be physical units, may be located in one position, or may be distributed on a plurality of units. Some or all of the units may be selected depending on actual requirements to achieve the objectives of the solutions of the embodiments.

In addition, functional units in the embodiments of the present disclosure may be integrated into one processing unit, or each of the units may exist alone physically, or two or more units may be integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The computer software product is stored in a storage medium and includes several instructions for instructing a computer device (which may be a personal computer, a server, a network device, or the like) to perform all or some of the steps of the methods described in the embodiments of the present disclosure. The foregoing storage medium includes any medium that can store program code, such as a USB flash drive, a read-only memory (ROM, Read-Only Memory), a random access memory (RAM, Random Access Memory), a removable hard disk, a magnetic disk, or an optical disc.

The foregoing descriptions are merely preferred implementations of the present disclosure. It should be noted that, improvements and modifications may be further made by a person of ordinary skill in the art without departing from the principles of the present disclosure, and these improvements and modifications shall also be construed as falling within the protection scope of the present disclosure.

What is claimed is:

1. A processing method for an overlapped multiplexing system, comprising:
receiving encoded information output by a transmit end, wherein the encoded information is obtained by performing error-correcting code encoding and overlapped multiplexing encoding on input information;
decoding the encoded information according to an overlapped multiplexing decoding algorithm, to obtain a first decoding result;
performing error-correcting processing on the first decoding result according to an error-correcting code decoding algorithm, to obtain a second decoding result; and
outputting the second decoding result;
wherein before the outputting the second decoding result, the method comprises:
determining whether the second decoding result meets a preset condition; and
if the second decoding result meets the preset condition, outputting the second decoding result; or
if the second decoding result does not meet the preset condition, obtaining feedback information according to the second decoding result;
decoding the encoded information and the feedback information according to the overlapped multiplexing decoding algorithm, to obtain a third decoding result;
performing error-correcting processing on the third decoding result according to the error-correcting code decoding algorithm, to obtain a fourth decoding result; and
using the fourth decoding result as the second decoding result, and returning to perform the step of determining whether the second decoding result meets the preset condition.

2. The method according to claim 1, wherein the determining whether the second decoding result meets a preset condition comprises:
obtaining a current quantity of iterations;
determining whether the current quantity of iterations exceeds a preset quantity of iterations; and
if the current quantity of iterations exceeds the preset quantity of iterations, determining that the second decoding result meets the preset condition; or
if the current quantity of iterations is less than the preset quantity of iterations, determining that the second decoding result does not meet the preset condition.

3. The method according to claim 2, wherein after the receiving encoded information output by a transmit end, the method further comprises:
performing preprocessing on the encoded information, to obtain processed encoded information.

4. The method according to claim 1, wherein the obtaining feedback information according to the second decoding result comprises:
using the second decoding result as the feedback information.

5. The method according to claim 4, wherein after the receiving encoded information output by a transmit end, the method further comprises:
performing preprocessing on the encoded information, to obtain processed encoded information.

6. The method according to claim 1, wherein the encoded information comprises first encoded information and second encoded information, wherein the first encoded information and the second encoded information have a same symbol length.

7. The method according to claim 6, wherein the decoding the encoded information according to an overlapped multiplexing decoding algorithm, to obtain a first decoding result comprises:

decoding the first encoded information according to a first overlapped multiplexing decoding algorithm, to obtain a fifth decoding result;
performing error-correcting processing on the fifth decoding result according to a first error-correcting code decoding algorithm, to obtain a sixth decoding result;
performing interleaving processing on the sixth decoding result according to a first interleaving algorithm, to obtain a first interleaving result; and
decoding the second encoded information and the first interleaving result according to a second overlapped multiplexing decoding algorithm, to obtain the first decoding result.

8. The method according to claim 7, wherein the performing error-correcting processing on the first decoding result according to an error-correcting code decoding algorithm, to obtain a second decoding result comprises:
performing error-correcting processing on the first decoding result according to a second error-correcting code decoding algorithm, to obtain the second decoding result.

9. The method according to claim 8, wherein after the receiving encoded information output by a transmit end, the method further comprises:
performing preprocessing on the encoded information, to obtain processed encoded information.

10. The method according to claim 7, wherein the obtaining feedback information according to the second decoding result comprises:
performing de-interleaving processing on the second decoding result according to a first de-interleaving algorithm, to obtain the feedback information, wherein the first de-interleaving algorithm is an inverse algorithm of the first interleaving algorithm.

11. The method according to claim 7, wherein after the receiving encoded information output by a transmit end, the method further comprises:
performing preprocessing on the encoded information, to obtain processed encoded information.

12. The method according to claim 6, wherein the decoding the encoded information according to an overlapped multiplexing decoding algorithm, to obtain a first decoding result comprises:
decoding the first encoded information according to a third overlapped multiplexing decoding algorithm, to obtain a seventh decoding result;
performing error-correcting processing on the seventh decoding result according to the error-correcting code decoding algorithm, to obtain an eighth decoding result;
performing interleaving processing on the eighth decoding result according to a second interleaving algorithm, to obtain a second interleaving result;
decoding the second encoded information and the second interleaving result according to a fourth overlapped multiplexing decoding algorithm, to obtain a ninth decoding result; and
performing de-interleaving processing on the ninth decoding result according to a second de-interleaving algorithm, to obtain the first decoding result, wherein the second de-interleaving algorithm is an inverse algorithm of the second interleaving algorithm.

13. The method according to claim 6, wherein after the receiving encoded information output by a transmit end, the method further comprises:
performing preprocessing on the encoded information, to obtain processed encoded information.

14. The method according to claim 1, wherein after the receiving encoded information output by a transmit end, the method further comprises:
performing preprocessing on the encoded information, to obtain processed encoded information.

15. A storage medium, wherein the storage medium comprises a stored program, and when the program runs, a device on which the storage medium is located is controlled to perform the processing method for an overlapped multiplexing system as claimed in claim 1.

16. A processor, wherein the processor is configured to run a program, and when the program runs, the processing method for an overlapped multiplexing system as claimed in claim 1 is performed.

17. A processing device for an overlapped multiplexing system, comprising:
a receiving module, configured to: receive encoded information output by a transmit end, wherein the encoded information is information obtained by performing error-correcting code encoding and overlapped multiplexing encoding on input information;
a first decoding module, configured to: decode the encoded information according to an overlapped multiplexing decoding algorithm, to obtain a first decoding result;
a second decoding module, configured to: perform error-correcting processing on the first decoding result according to an error-correcting code decoding algorithm, to obtain a second decoding result; and
an output module, configured to: output the second decoding result;
wherein before the output module output the second decoding result, the processing device is further configured to:
determine whether the second decoding result meets a preset condition; and
if the second decoding result meets the preset condition, output the second decoding result; or
if the second decoding result does not meet the preset condition, obtain feedback information according to the second decoding result;
decode the encoded information and the feedback information according to the overlapped multiplexing decoding algorithm, to obtain a third decoding result;
perform error-correcting processing on the third decoding result according to the error-correcting code decoding algorithm, to obtain a fourth decoding result; and
use the fourth decoding result as the second decoding result, and return to perform the step of determining whether the second decoding result meets the preset condition.

18. A processing system for an overlapped multiplexing system, comprising:
a transmit end, configured to: output encoded information, wherein the encoded information is information obtained by performing error-correcting code encoding and overlapped multiplexing encoding on input information; and
a receive end, having a communication relationship with the transmit end and configured to:
decode the encoded information according to an overlapped multiplexing decoding algorithm, to obtain a first decoding result; perform error-correcting processing on the first decoding result according to an error-correcting code decoding algorithm, to obtain a second decoding result; and output the second decoding result;
wherein before the receive end output the second decoding result, the receive end is further configured to:
determine whether the second decoding result meets a preset condition; and
if the second decoding result meets the preset condition, output the second decoding result; or
if the second decoding result does not meet the preset condition, obtain feedback information according to the second decoding result;
decode the encoded information and the feedback information according to the overlapped multiplexing decoding algorithm, to obtain a third decoding result;
perform error-correcting processing on the third decoding result according to the error-correcting code decoding algorithm, to obtain a fourth decoding result; and
use the fourth decoding result as the second decoding result, and return to perform the step of determining whether the second decoding result meets the preset condition.

* * * * *